United States Patent
Pan et al.

(10) Patent No.: US 10,853,295 B2
(45) Date of Patent: Dec. 1, 2020

(54) INTERFACE CIRCUIT AND METHOD FOR CONTROLLING SWITCHING CIRCUIT WITHIN INTERFACE CIRCUIT

(71) Applicant: Realtek Semiconductor Corp., HsinChu (TW)

(72) Inventors: Jiun-Hung Pan, Hsinchu County (TW); Leaf Chen, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/576,756

(22) Filed: Sep. 19, 2019

(65) Prior Publication Data

US 2020/0125519 A1    Apr. 23, 2020

(30) Foreign Application Priority Data

Oct. 22, 2018   (TW) .............................. 107137134 A

(51) Int. Cl.
  *G06F 13/40*  (2006.01)
  *G06F 13/42*  (2006.01)
  *H03K 19/003* (2006.01)

(52) U.S. Cl.
  CPC ...... *G06F 13/4022* (2013.01); *G06F 13/4081* (2013.01); *G06F 13/4282* (2013.01); *H03K 19/00361* (2013.01); *G06F 2213/0042* (2013.01)

(58) Field of Classification Search
  None
  See application file for complete search history.

(56) References Cited

U.S. PATENT DOCUMENTS

| 5,440,441 A * | 8/1995 | Ahuja ...................... H02H 3/06 361/62 |
| 8,829,944 B1 * | 9/2014 | Miller .............. H03K 3/356104 327/427 |
| 2007/0285861 A1 | 12/2007 | Kim |
| 2011/0080206 A1 | 4/2011 | Koch |
| 2013/0234678 A1 * | 9/2013 | Patterson ................ H02P 9/302 322/28 |
| 2015/0280602 A1 * | 10/2015 | Ichihara ................ H02M 1/126 363/37 |
| 2018/0248353 A1 | 8/2018 | Creech |

FOREIGN PATENT DOCUMENTS

CN         108292837 A      7/2018

* cited by examiner

*Primary Examiner* — Farley Abad
*Assistant Examiner* — Dayton Lewis-Taylor
(74) *Attorney, Agent, or Firm* — Winston Hsu

(57) ABSTRACT

The present invention provides an interface circuit, wherein the interface circuit includes a switching circuit, an over-voltage detection circuit and a control signal generating circuit. In the operations of the interface circuit, the switching circuit is configured to receive an input signal from an input terminal, and selectively transmit the input signal to an internal circuit. The over-voltage detection circuit is configured to detect whether a voltage level of the input signal is greater than a threshold value, and accordingly generate at least one over-voltage signal. The control signal generating circuit is configured to generate a control signal according to said at least one over-voltage signal, to control the switching circuit to be in one of three or more states.

16 Claims, 6 Drawing Sheets

INTERFACE CIRCUIT AND METHOD FOR CONTROLLING SWITCHING CIRCUIT WITHIN INTERFACE CIRCUIT

BACKGROUND OF THE INVENTION

1. Field of the Invention

The present invention is related to interface circuits, and more particularly, to an interface circuit having over-voltage protection, and a method for controlling a switching circuit within an interface circuit.

2. Description of the Prior Art

In a conventional Universal Serial Bus (USB) connector, a switching circuit and a related over-voltage protection circuit are installed in an interface circuit of the connector to perform related over-voltage protection in order to prevent a sudden high voltage from being transmitted to internal low voltage components through an input terminal of the connector. This is achieved by instantly and quickly turning off the switching circuit in order to prevent the internal low voltage components from being damaged. Enabling the switching circuit to quickly be turned off can result in the switching circuit being easily interfered with noise, meaning the switching circuit can be turned off by mistake. For example, a small voltage pulse on the input terminal of the connector might cause the switching circuit to be turned off, thereby interrupting signal transmission, which may cause abnormal operations of related circuits. In comparison, extending reaction time of the over-voltage protection circuit might raise the risk of back-end low voltage component damage.

SUMMARY OF THE INVENTION

Therefore, an objective of the present invention is to provide an interface circuit and a method for controlling a switching circuit within an interface circuit, which can prevent the switching circuit from being turned off due to a small voltage pulse, while still effectively protecting back-end low voltage circuits, to solve the aforementioned related art problems.

In an embodiment of the present invention, an interface circuit is disclosed, which comprises a switching circuit, an over-voltage detection circuit and a control signal generating circuit. In operations of the interface circuit, the switching circuit is configured to receive an input signal from an input terminal, and selectively transmit the input signal to an internal circuit; the over-voltage detection circuit is configured to detect whether a voltage level of the input signal is greater than a threshold value, and accordingly generate at least one over-voltage signal; and the control signal generating circuit is configured to generate a control signal according to said at least one over-voltage signal, to control the switching circuit to be in one of three or more states.

In another embodiment of the present invention, a method for controlling a switching circuit within an interface circuit is disclosed, wherein the switching circuit is configured to receive an input signal from an input terminal and selectively transmit the input signal to an internal circuit, and the method comprises: detecting whether a voltage level of the input signal is greater than a threshold value, and accordingly generating at least one over-voltage signal; and generating a control signal according to said at least one over-voltage signal, to control the switching circuit to be in one of three or more states.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
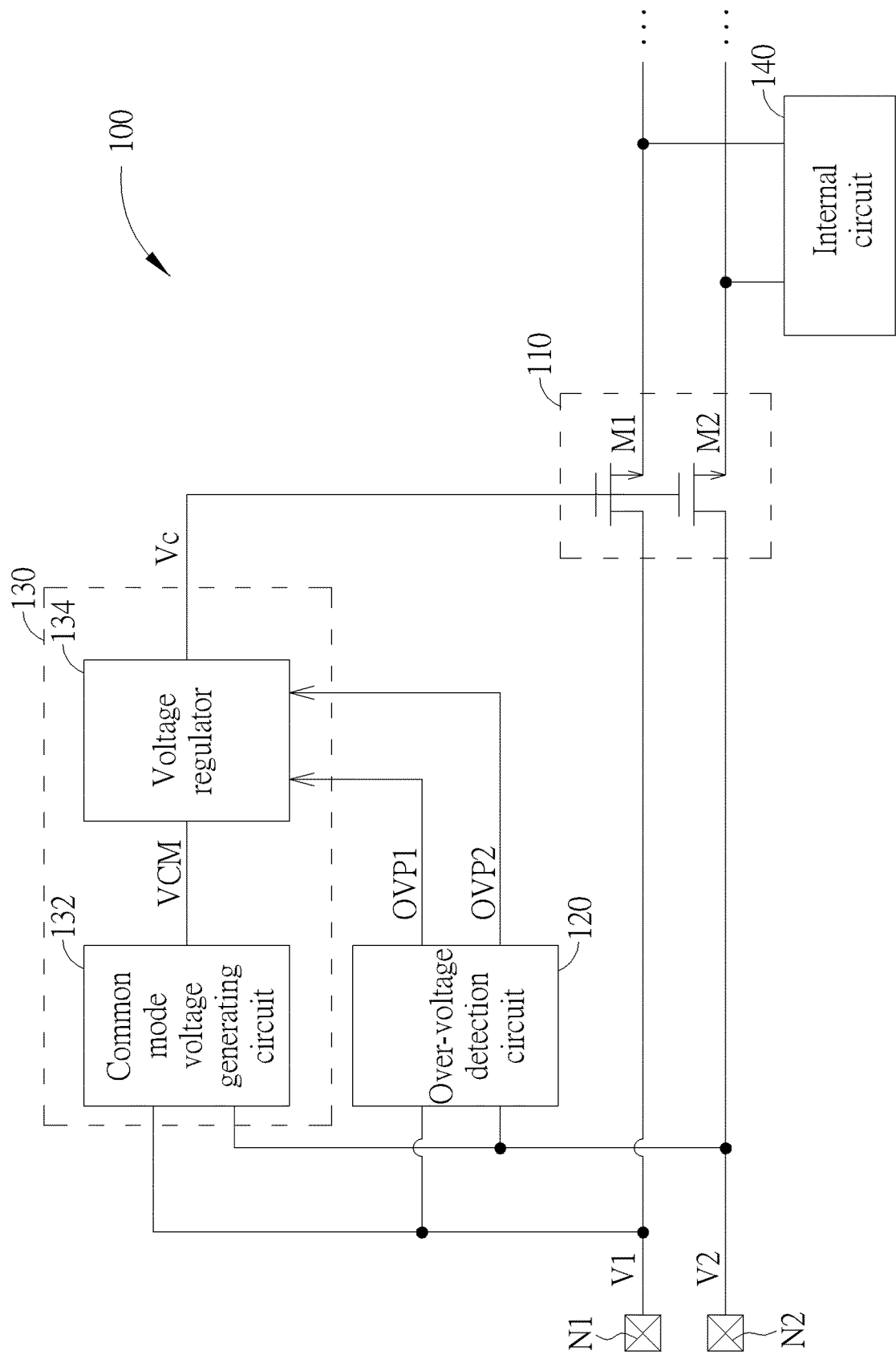
FIG. 1 is a diagram illustrating an interface circuit according to an embodiment of the present invention.

FIG. 1 is a diagram illustrating an interface circuit 100 according to an embodiment of the present invention. As shown in FIG. 1, the interface circuit 100 comprises two input terminals N1 and N2, a switching circuit comprising two transistors M1 and M2, an over-voltage detection circuit 120, a control signal generating circuit 130 and an internal circuit 140, where the control signal generating circuit 130 comprises a common mode voltage generating circuit 132 and a voltage regulator 134. In this embodiment, the interface circuit 100 is an interface circuit conforming to the USB 3.0 specification, where the interface circuit 100 is equipped in a USB connector to receive input signals V1 and V2 (which are differential signals in this embodiment) from another device, and selectively transmit the input signals V1 and V2 to the internal circuit 140 in the back-end, but the present invention is not limited thereto.

Figure 2:
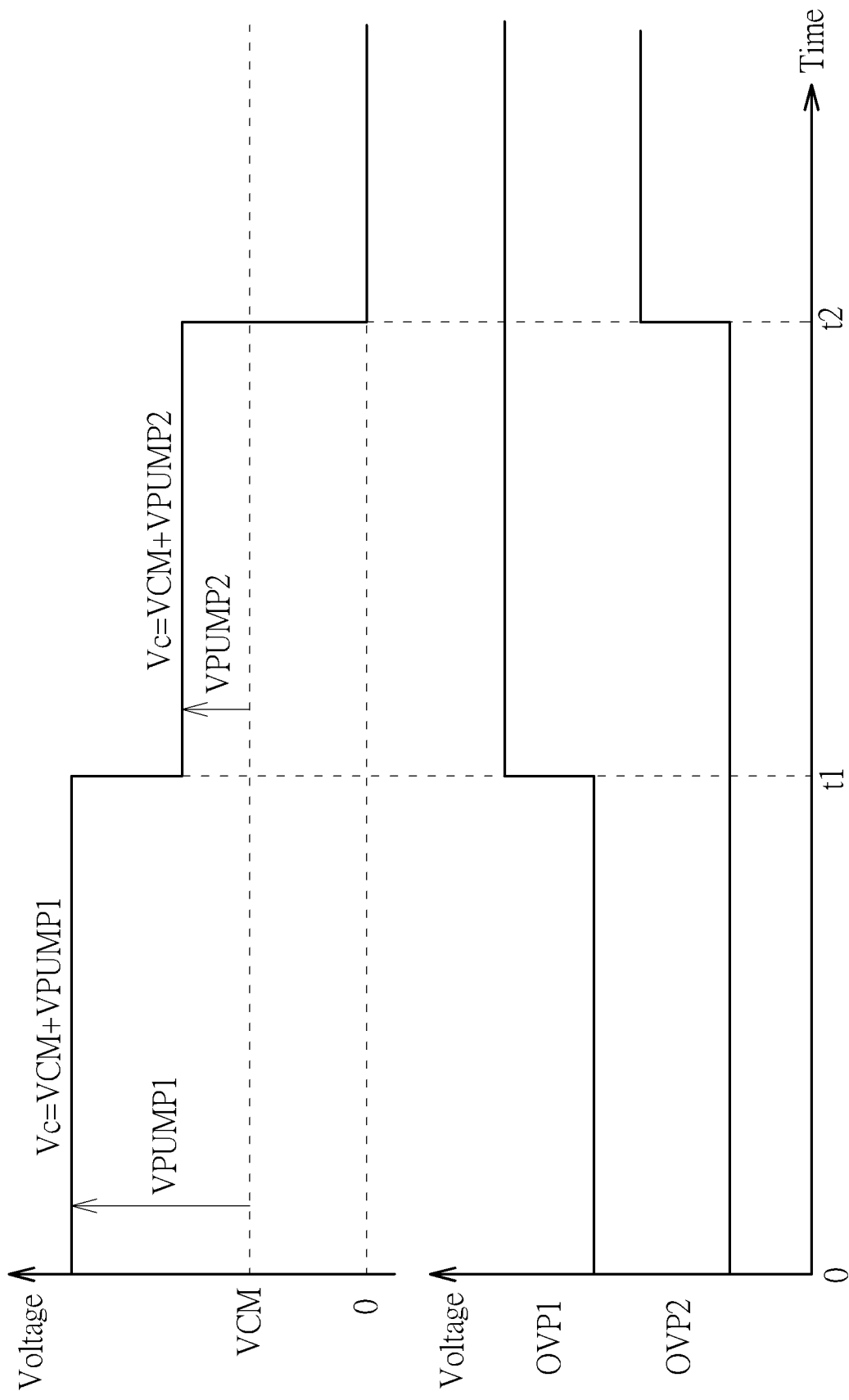
FIG. 2 is a diagram illustrating operations of an over-voltage detection circuit and a control signal generating circuit according to an embodiment of the present invention.

In operations of the interface circuit 100, under a normal condition and referring to a time interval between 0 to t1 shown in FIG. 2, voltage levels of the input signal V1 and V2 are located within a range (e.g. no over-voltage), and the common mode voltage generating circuit 132 may generate a common mode voltage VCM according to the input signals V1 and V2 at this moment, where the common mode voltage VCM may be an average of the input signals V1 and V2. The voltage regulator 134 then increases the common mode voltage VCM by a first voltage level VPUMP1 to generate a control signal Vc, to control the transistors M1 and M2 within the switching circuit 110 to be conductive. In this embodiment, the first voltage level VPUMP1 may be a higher voltage value such as 5V, and the control signal Vc is taken as gate control voltages of the transistors M1 and M2; for example, the transistors M1 and M2 have very high gate voltages under the normal condition, to guarantee that the switching circuit 110 is successfully conductive so that the input signals V1 and V2 can be transmitted to the internal circuit 140 in the back-end.

When the over-voltage detection circuit detects that the voltage levels of the input signals V1 and V2 are greater than a threshold value VTH (e.g. at the time point t1 shown in FIG. 2), the over-voltage detection circuit 120 may generate a first over-voltage signal OVP1 to the voltage regulator 134, and the voltage regulator 134 may increase the common mode voltage VCM by a second voltage level VPUMP2 to generate the control signal Vc, to control the transistors M1 and M2 within the switching circuit 110 to be conductive. In this embodiment, the second voltage level VPUMP2 may be a lower voltage such as 2V. Thus, when the over-voltage detection circuit detects that the voltage levels of the input signals V1 and V2 are greater than the threshold value VTH, the control signal Vc generated by the voltage regulator 134 may be taken as lower gate voltages which are able to make the transistors M1 and M2 be conductive, and the switching circuit 110 is still able to allow the input signals to be transmitted to the internal circuit 140 in the back-end.

Figure 3:
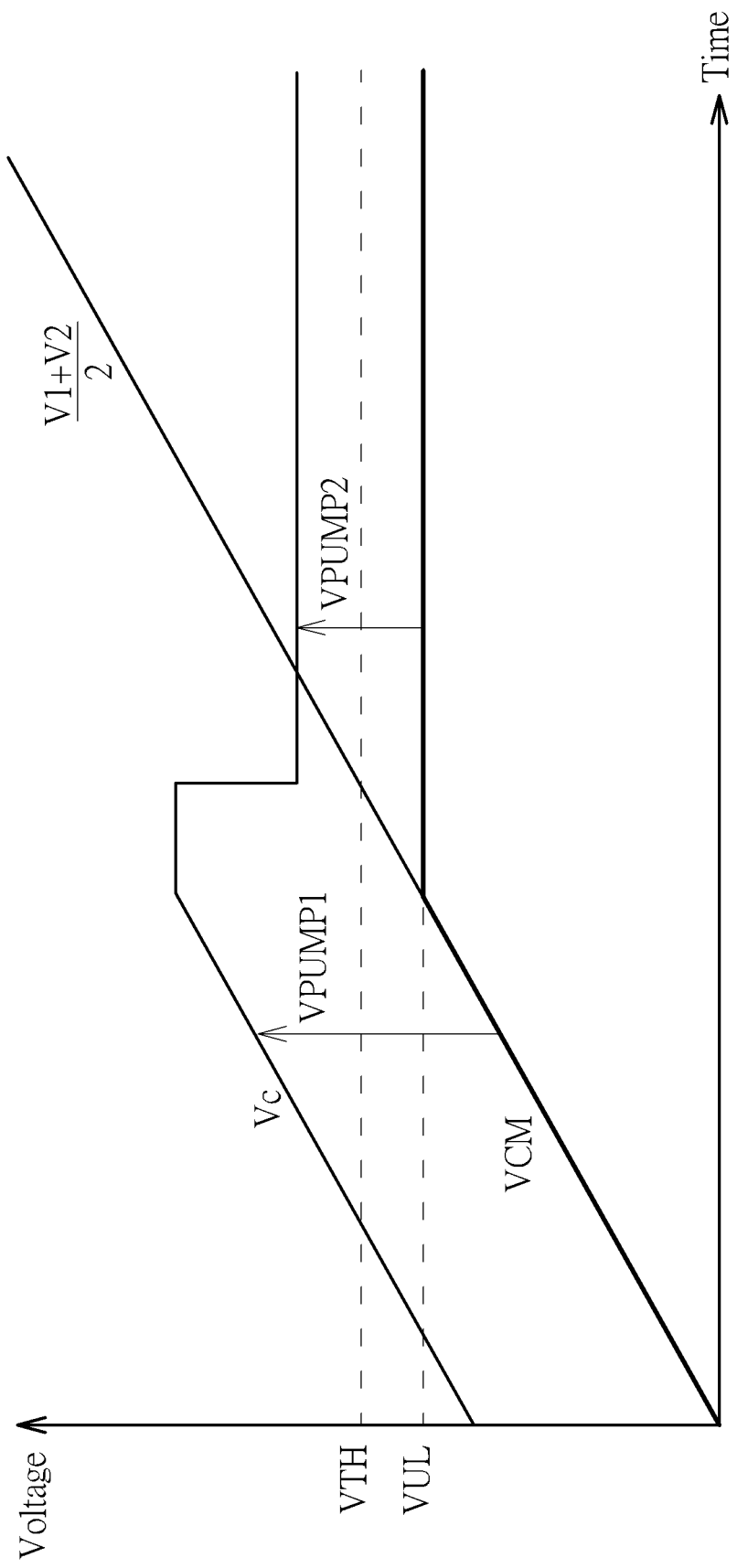
FIG. 3 is a diagram illustrating a common mode voltage and a control signal in an embodiment of the present invention.

In this embodiment, the over-voltage detection circuit 120 can detect whether a common mode voltage of the input signal signals V1 and V2 is greater than the threshold value VTH in order to generate the first over-voltage signal OVP1, and the common mode voltage VCM generated by the common mode voltage generating circuit 132 has an upper limit value, which allows the lower gate voltages to be applied to the transistors M1 and M2. More particularly, referring to FIG. 3, which is a diagram illustrating the common mode voltage VCM and the control signal Vc, when the common mode voltage of the input signals V1 and V2 exceeds the upper limit value VUL, the common mode voltage VCM generated by the common mode voltage generating circuit 132 is limited to equal to the upper limit value only, and does not continually increase; additionally, when the common mode voltage of the input signals V1 and V2 is greater than the threshold value VTH, the voltage level increased by the voltage regulator 134 may be changed to the second voltage level VPUMP2 from the first voltage level VPUMP1.

After a predetermined time, such as 20 nanoseconds later, if the over-voltage detection circuit 120 detects that the voltage levels of the input signals V1 and V2 are still greater than the threshold value VTH (e.g. at a time point t2 shown in FIG. 2), the over-voltage detection circuit 120 may generate a second over-voltage signal OVP2 to the voltage regulator 134, and the voltage regulator 134 may generate the control signal Vc to make the transistor M1 and M2 be non-conductive. Thus, the switching circuit 110 is turned off in order to prevent low voltage components of the internal circuit 140 from being damaged due to high voltage levels of the input signals V1 and V2. In this embodiment, the control signal Vc at this moment is a ground voltage, but the present invention is not limited thereto. In addition, in this embodiment and the following description, a determination condition of whether the over-voltage detection circuit 120 generates the first over-voltage signal OVP1 and/or the second over-voltage signal OVP2 may be any of the voltage levels of the input signals V1 and V2 being greater than the threshold value VTH or both of the voltage levels of the input signals V1 and V2 being greater than the threshold value VTH, but the present invention is not limited thereto.

Additionally, if the over-voltage detection circuit 120 detects that the voltage levels of the input signal V1 and V2 are lower than the threshold value VTH, the over-voltage condition that is previously detected by the over-voltage detection circuit 120 may be regarded as noise interference, and the voltage regulator 134 will return to generate the control signal Vc through increasing the common mode voltage VCM by the first voltage level VPUMP1, to make the transistors M1 and M2 have higher gate voltages.

As mentioned above, since the over-voltage detection circuit 120 detects that the voltage levels of the input signals V1 and V2 are greater than the threshold value VTH, the control signal generating circuit 130 may apply the lower gate voltages to the transistors M1 and M2, rather than turn off the transistors M1 and M2 immediately. Thus, a condition where the internal circuit 140 of the back-end is unable to receive the input signal due to noise interference can be avoided. Additionally, since the lower gate voltages may be applied to the transistors M1 and M2 when the over-voltage detection circuit 120 detects that the voltage levels of the input signals are greater than the threshold value VTH, the control signal generating circuit 130 can quickly turn off the transistors M1 and M2 if the over-voltage detection circuit 120 keeps detecting that the voltage levels of the input signals V1 and V2 are greater than the threshold value VTH (e.g. the interface circuit 100 might indeed suffer a high voltage input), which can prevent the internal circuit 140 from being damaged.

Figure 4:
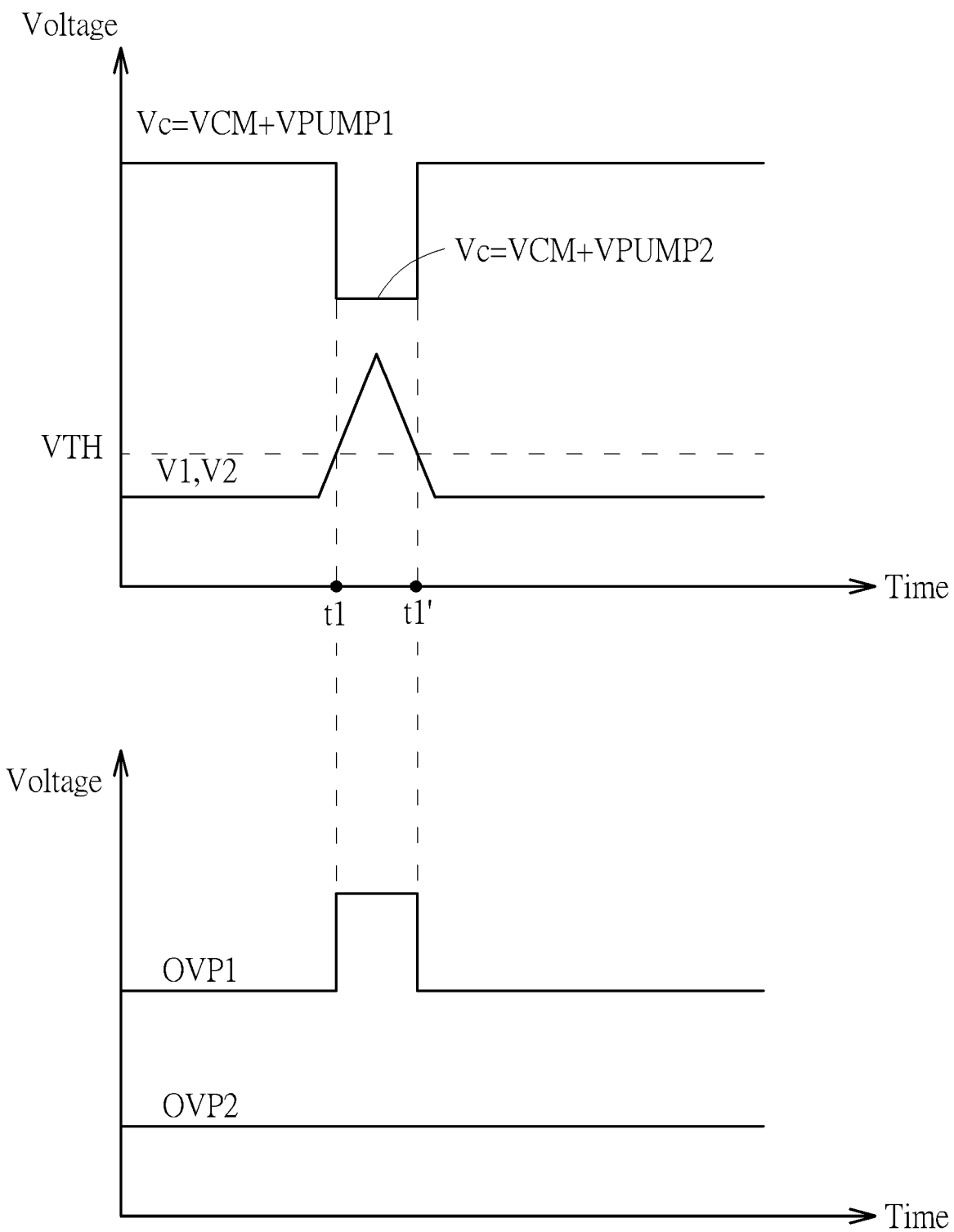
FIG. 4 is a diagram illustrating operations of an over-voltage detection circuit and a control signal generating circuit when the interface circuit suffers noise interference according to an embodiment of the present invention.

FIG. 4 is a diagram illustrating that the interface circuit 100 suffers noise interference according to an embodiment of the present invention. As shown in FIG. 4, assuming that the over-voltage detection circuit 120 detects that the voltage levels of the input signal V1 and V2 are greater than the threshold value VTH at the time point t1, the over-voltage detection circuit 120 may generate the first over-voltage signal OVP1 to the voltage regulator 134 in order to generate the control signal Vc through increasing the common mode voltage VCM by the voltage level VPUMP2; then, the over-voltage detection circuit 120 detects that the voltage levels of the input signal V1 and V2 are not greater than the threshold value at a time point t1', and the over-voltage detection circuit 120 therefore stops generating the first over-voltage signal OVP1 to the voltage regulator 134 (e.g. the first over-voltage signal OVP1 is changed to a low voltage level). In this embodiment, since a time difference between the time points t1 and t1' is less than the predetermined time for generating the second over-voltage signal OVP2 (e.g. the aforementioned 20 nanoseconds), the over-voltage detection circuit 120 does not generate the second over-voltage signal OVP2, and the regulator may return to generate the control signal Vc through increasing the common mode voltage VCM by the first voltage level VPUMP1, to make the transistors M1 and M2 have higher gate voltages.

The common mode voltage generating circuit 132 and the voltage regulator 134 in the control signal generating circuit 120 shown in FIG. 1 are for illustrative purposes only, not limitations of the present invention. In other embodiments of the present invention, the control signal generating circuit 120 may utilize other components and methods to generate the control signal Vc. As long as the control signal generating circuit 120 is able to reduce the voltage level of the control signal Vc when receiving the first over-voltage signal OVP1, and generate the control signal Vc to turn off the transistors M1 and M2 when receiving the second over-voltage signal OVP2, the internal circuit can be designed in different ways, and modifications of the above design should also belong to the present invention.

Figure 5:
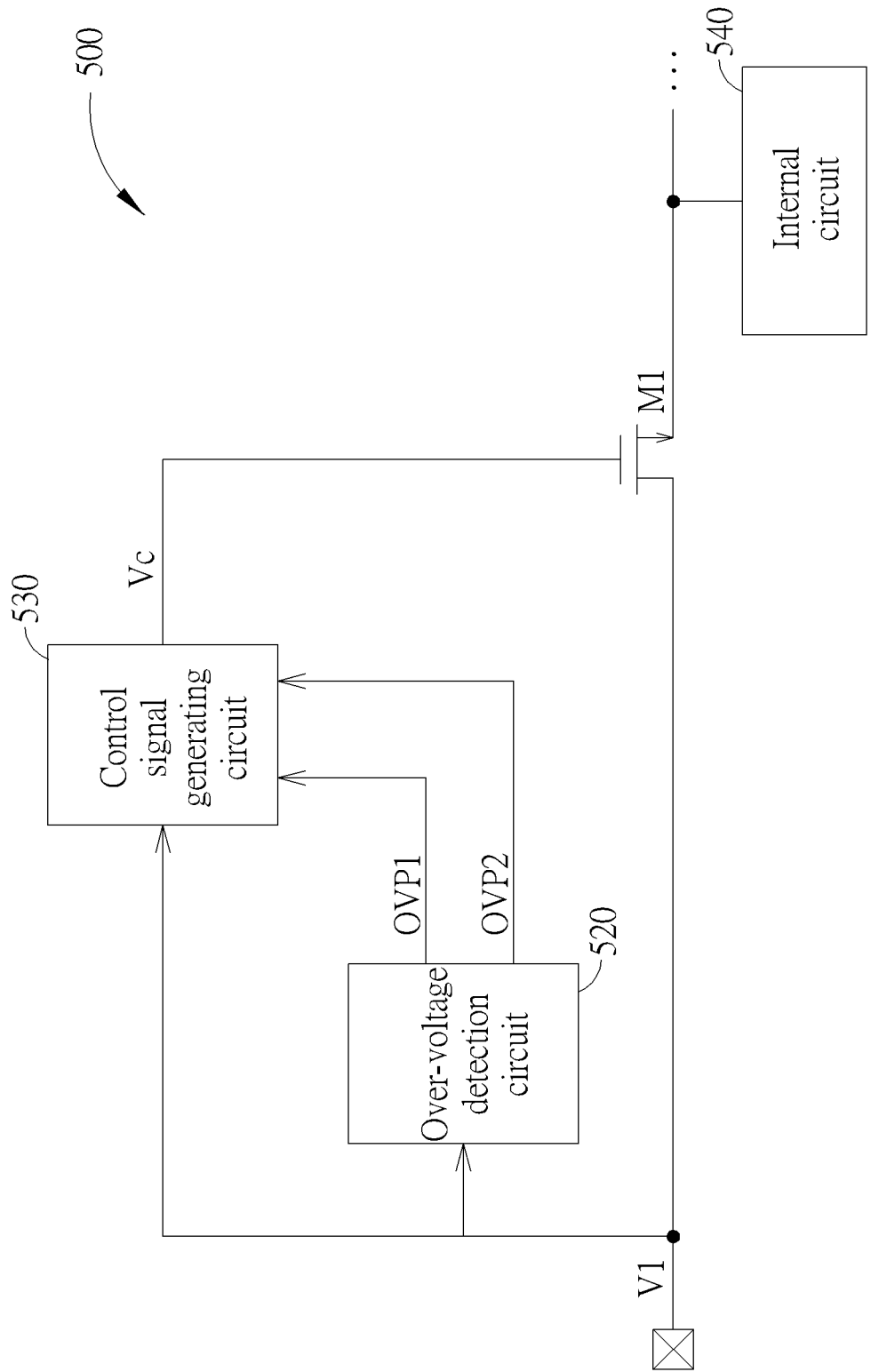
FIG. 5 is a diagram illustrating an interface circuit according to another embodiment of the present invention.

It should be noted that the embodiment shown in FIG. 1 is described according to the differential input signals V1 and V2, but the control method of the interface circuit of the present invention can be applied to a single-ended input. As shown in FIG. 5, an interface circuit 500 comprises an input terminal N1, a transistor which is taken as a switching circuit, an over-voltage detection circuit 520, a control signal generating circuit 530 and an internal circuit 540. A difference between the interface circuit 500 and the interface circuit 100 shown in FIG. 1 is that the interface circuit 500 receives a single-ended signal and the interface circuit 100 receives differential signals. Those skilled in the art should understand operations of the over-voltage detection circuit 520, the control signal generating circuit 530 and the transistor M1 from reading the above description; related details are therefore omitted for brevity.

Figure 6:
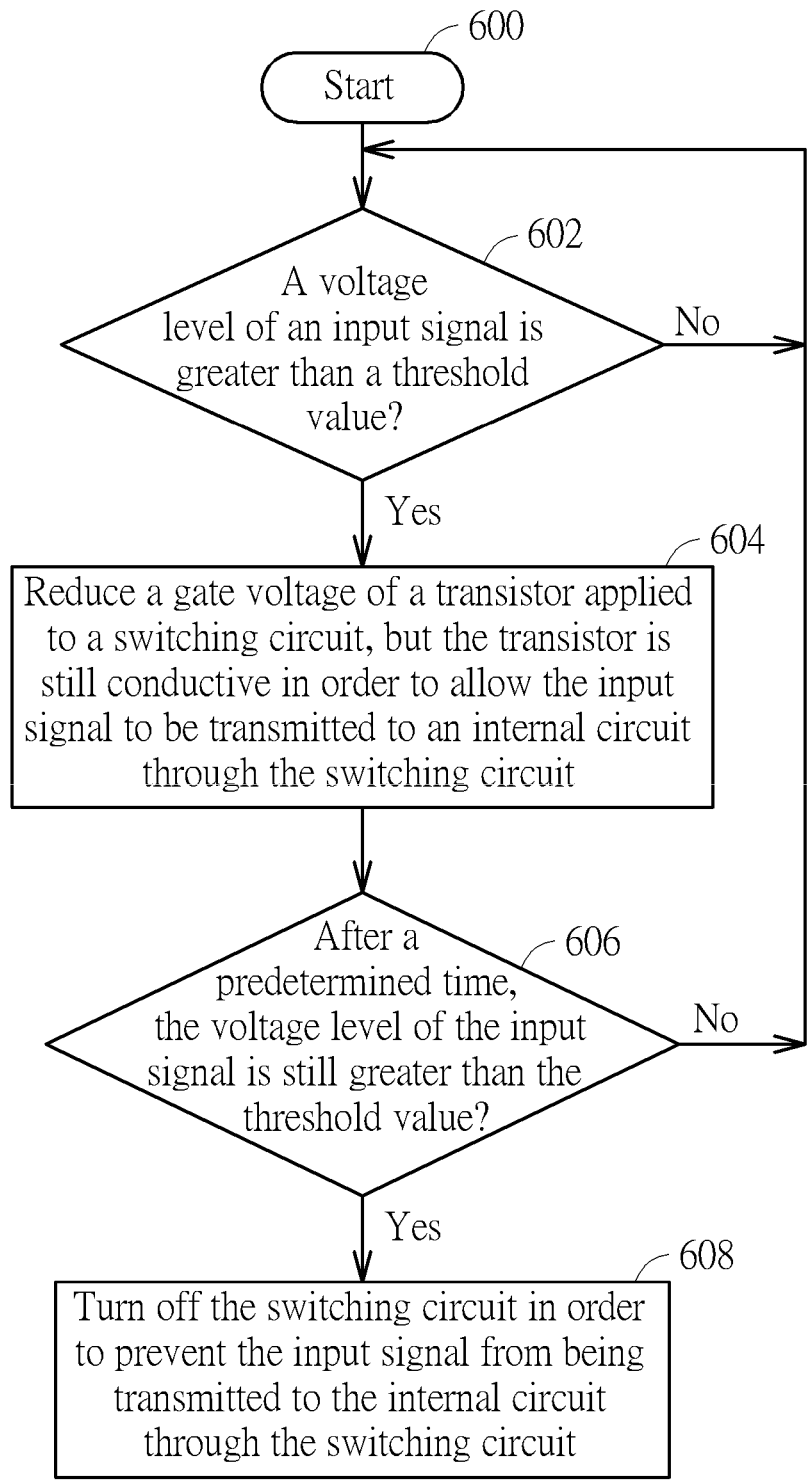
FIG. 6 is a flowchart illustrating a method for controlling a switching circuit within an interface circuit according to an embodiment of the present invention.

FIG. 6 is a flowchart illustrating a method for controlling a switching circuit within an interface circuit according to an embodiment of the present invention. Referring to the descriptions of the above embodiments, the flow is as follows.

Step 600: the flow starts.

Step 602: detect whether a voltage level of an input signal is greater than a threshold value; if yes, the flow enters Step 604; if not, the flow returns to Step 602 to keep detecting whether the voltage level of the input signal is greater than the threshold value.

Step 604: reduce a gate voltage of a transistor applied to a switching circuit, but the transistor is still conductive in order to allow the input signal to be transmitted to an internal circuit through the switching circuit.

Step 606: After a predetermined time, determine whether the voltage level of the input signal is still greater than the threshold value; if yes, the flow enters Step 608; if not, the flow returns to Step 602.

Step 608: turn off the switching circuit in order to prevent the input signal from being transmitted to the internal circuit through the switching circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An interface circuit, comprising:
   a switching circuit, configured to receive an input signal from an input terminal, and selectively transmit the input signal to an internal circuit;
   an over-voltage detection circuit, configured to detect whether a voltage level of the input signal is greater than a threshold value, and accordingly generate at least one over-voltage signal; and
   a control signal generating circuit, configured to generate a control signal according to said at least one over-voltage signal, to control the switching circuit to be in one of three or more states;
   wherein the switching circuit comprises a transistor, and the three or more states comprise a first state, a second state and a third state; the first state indicates that a first gate voltage is applied to the transistor and the transistor is therefore conductive, the second state indicates that a second gate voltage that is different from the first gate voltage is applied to the transistor and the transistor is therefore conductive, and the third state indicates that a third gate voltage is applied to the transistor and the transistor is therefore non-conductive.

2. The interface circuit of claim 1, wherein when the over-voltage detection circuit detects that the voltage level of the input signal is not greater than the threshold value, the control signal generating circuit generates the control signal to control the switching circuit to be in the first state; when the over-voltage detection circuit detects that the voltage level of the input signal is greater than the threshold value, the over-voltage detection circuit generates a first over-voltage signal to make the control signal generating circuit generate the control signal to control the switching circuit to be in the second state; and after the switching circuit has been controlled to be in the second state for a predetermined time, the over-voltage detection circuit detects whether the voltage level of the input signal is greater than the threshold value, to determine whether to generate a second over-voltage signal to make the control signal generating circuit generate the control signal to control the switching circuit to be in the third state.

3. The interface circuit of claim 2, wherein after the switching circuit has been controlled to be in the second state for the predetermined time, if the over-voltage detection circuit detects that the voltage level of the input signal is greater than the threshold value, the over-voltage detection circuit generates the second over-voltage signal to make the control signal generating circuit generate the control signal to control the switching circuit to be in the third state; and if the over-voltage detection circuit detects that the voltage level of the input signal is not greater than the threshold value, the control signal generating circuit generates the control signal to control the switching circuit to return to the first state.

4. The interface circuit of claim 1, wherein a value of the second gate voltage is between the first gate voltage and the third gate voltage.

5. The interface circuit of claim 1, wherein the input signal is a differential signal, and the control signal generating circuit comprises:
   a common mode voltage generating circuit, configured to generate a common mode voltage of the input signal according to the input signal; and
   a voltage regulator, coupled to the common mode voltage generating circuit, configured to generate the control signal according to the common mode voltage and said at least one over-voltage signal, to control the switching circuit.

6. The interface circuit of claim 5, wherein the common mode voltage outputted by the common mode voltage generating circuit is limited to be not greater than an upper limit value.

7. The interface circuit of claim 5, wherein when the over-voltage detection circuit detects that a voltage level of at least one signal of the differential signal is not greater than the threshold value, the voltage regulator generates the control signal according to the common mode voltage, to control the switching circuit to be in the first state; when the over-voltage detection circuit detects that the voltage level of said at least one signal of the differential signal is greater than the threshold value, the over-voltage detection circuit generates a first over-voltage signal to make the voltage regulator generate the control signal according to the common mode voltage, to control the switching circuit to be in the second state; and after the switching circuit has been controlled to be in the second state for a predetermined time, the over-voltage detection circuit detects whether the voltage level of said at least one signal of the differential signal is greater than the threshold value, to determine whether to generate a second over-voltage signal to make the voltage regulator generate the control signal to control the switching circuit to be in the third state.

8. The interface circuit of claim 7, wherein the first gate voltage is generated by the voltage regulator increasing the common mode voltage by a first voltage level, and the second gate voltage is generated by the voltage regulator increasing the common mode voltage by a second voltage level which is lower than the first voltage level.

9. A method for controlling a switching circuit within an interface circuit, wherein the switching circuit is configured to receive an input signal from an input terminal and selectively transmit the input signal to an internal circuit, and the method comprises:
    detecting whether a voltage level of the input signal is greater than a threshold value, and accordingly generating at least one over-voltage signal; and
    generating a control signal according to said at least one over-voltage signal, to control the switching circuit to be in one of three or more states;
    wherein the switching circuit comprises a transistor, and the three or more states comprise a first state, a second state and a third state; the first state indicates that a first gate voltage is applied to the transistor and the transistor is therefore conductive, the second state indicates that a second gate voltage that is different from the first gate voltage is applied to the transistor and the transistor is therefore conductive, and the third state indicates that a third gate voltage is applied to the transistor and the transistor is therefore non-conductive.

10. The method of claim 9, wherein the step of generating the control signal according to said at least one over-voltage signal to control the switching circuit to be in the one of three or more states comprises:
    when detecting that the voltage level of the input signal is not greater than the threshold value, generating the control signal to control the switching circuit to be in the first state;
    when detecting that the voltage level of the input signal is greater than the threshold value, generating the control signal according to a first over-voltage signal to control the switching circuit to be in the second state; and
    after the switching circuit has been controlled to be in the second state for a predetermined time, detecting whether the voltage level of the input signal is greater than the threshold value, to determine whether to generate the control signal according to a second over-voltage signal to control the switching circuit to be in the third state.

11. The method of claim 10, wherein the step of detecting whether the voltage level of the input signal is greater than the threshold value to determine whether to generate the control signal according to the second over-voltage signal to control the switching circuit to be in the third state comprise:
    after the switching circuit has been controlled to be in the second state for the predetermined time, if detecting that the voltage level of the input signal is greater than the threshold value, generating the control signal according to the second over-voltage signal to control the switching circuit to be in the third state; and
    if detecting that the voltage level of the input signal is not greater than the threshold value, generating the control signal to control the switching circuit to return to the first state.

12. The method of claim 9, wherein a value of the second gate voltage is between the first gate voltage and the third gate voltage.

13. The method of claim 9, wherein the input signal is a differential signal, and the step of generating the control signal according to said at least one over-voltage signal to control the switching circuit comprises:
    generating a common mode voltage of the input signal according to the input signal; and
    generating the control signal according to the common mode voltage and said at least one over-voltage signal, to control the switching circuit.

14. The method of claim 13, wherein the common mode voltage is limited to be not greater than an upper limit value.

15. The method of claim 13, wherein the step of generating the control signal according to said at least one over-voltage signal to control the switching circuit to be in the one of three or more states comprises:
    when detecting that a voltage level of at least one signal of the differential signal is not greater than the threshold value, generating the control signal according to the common mode voltage, to control the switching circuit to be in the first state;
    when detecting that the voltage level of said at least one signal of the differential signal is greater than the threshold value, generating the control signal according to a first over-voltage signal and the common mode voltage to control the switching circuit to be in the second state; and
    after the switching circuit has been controlled to be in the second state for a predetermined time, detecting whether the voltage level of said at least one signal of the differential signal is greater than the threshold value, to determine whether to generate the control signal according to a second over-voltage signal to control the switching circuit to be in the third state.

16. The method of claim 15, wherein the first gate voltage is generated by increasing the common mode voltage by a first voltage level, and the second gate voltage is generated by increasing the common mode voltage by a second voltage level which is lower than the first voltage level.

* * * * *